(12) United States Patent
Adair

(10) Patent No.: US 10,663,488 B1
(45) Date of Patent: May 26, 2020

(54) ARC SAFE ELECTRICAL TESTING SYSTEM

(71) Applicant: Adrian R. Adair, Sacramento, CA (US)

(72) Inventor: Adrian R. Adair, Sacramento, CA (US)

( * ) Notice: Subject to any disclaimer, the term of this patent is extended or adjusted under 35 U.S.C. 154(b) by 71 days.

(21) Appl. No.: 16/032,357

(22) Filed: Jul. 11, 2018

(51) Int. Cl.
*G01R 1/073* (2006.01)

(52) U.S. Cl.
CPC .............................. *G01R 1/07378* (2013.01)

(58) Field of Classification Search
None
See application file for complete search history.

(56) References Cited

U.S. PATENT DOCUMENTS

| | | | | |
|---|---|---|---|---|
| 3,753,090 A * | 8/1973 | Tomek | ................... | F21V 33/00 324/506 |
| 4,227,145 A * | 10/1980 | Bonikowski | ......... | G01R 31/021 324/522 |
| 4,864,107 A * | 9/1989 | Boyal | ..................... | H05B 3/56 219/549 |
| 5,214,385 A * | 5/1993 | Gabriel | ............ | G01R 19/16542 320/121 |
| 6,538,201 B1 * | 3/2003 | Gretz | ................... | H02G 3/0691 16/2.1 |
| 7,538,557 B2 | 5/2009 | Dehaven | | |
| 2004/0130454 A1 * | 7/2004 | Barton | ...................... | F24F 11/30 340/657 |
| 2009/0174394 A1 * | 7/2009 | Armstrong | ............... | G01R 1/36 324/115 |
| 2010/0023286 A1 * | 1/2010 | Rodseth | ................. | G01R 31/07 702/65 |
| 2018/0113154 A1 * | 4/2018 | Lago | ........................ | G01R 1/36 |

\* cited by examiner

*Primary Examiner* — Jas A Sanghera
(74) *Attorney, Agent, or Firm* — Sanchelima & Associates, P.A.; Christian Sanchelima, Esq.; Jesus Sanchelima, Esq.

(57) ABSTRACT

The present invention provides an electrical testing system configured to provide safeguards for technicians against the hazards of exposure to arc flashes. The electrical testing system includes a fused test connection having a fuse incorporated in test leads thereof. The fuse is provided at first ends of the test leads which is disposed proximal to electrical unit during testing. The test leads are adapted to be connected to the electrical units for testing, either temporary using alligator-type clips, or permanently using ring-type clips. The electrical testing system also incorporate a 5-pole insulated female plug disposed generally at second ends of the test leads, in the fused test connection, for the electrical testing system.

13 Claims, 4 Drawing Sheets

ARC SAFE ELECTRICAL TESTING SYSTEM

BACKGROUND OF THE INVENTION

1. Field of the Invention

The present disclosure generally relates to an electrical testing system; and more particularly relates to a fused test connection for electrical testing system with a fuse incorporated in test leads thereof, to provide safety for the technicians against the hazards of exposure to electric arc flashes.

2. Description of the Related Art

Electrical testing is used to check both AC and DC voltage, continuity, circuit problems, amperage, shorted and open circuit problems, and to make sure the voltages are correct at the electrical panel. It is typically mandatory that all electrical systems are tested after installation and before commissioning. Testing of electrical and electronic equipment exposes the technician to potentially lethal voltages, and possible arc flashes. Arc flash is an extremely dangerous, and sometimes lethal, condition arising in electrical equipment. Arc flashes occur when an electric current passes through an air gap between electrified conductors, or from conductor to ground, when the insulation or isolation is not sufficient to withstand the applied voltage.

Arc flash can be caused because of insulation failure, contacting a test probe to the wrong surface, or because of an accidental slip of a tool, etc. Low voltage (e.g., less than 240 volts) and low amperage (e.g., less than 1000 amps) circuits present negligible risk of arc flash. However, with electrical circuits operating, for example, at several hundred volts and several thousand amps, the energy radiated by an arc flash can be several megawatts. While the arc flash event itself can occur almost immediately, or within a few milliseconds, the results can be lasting, ranging from superficial burns to debilitating injury, or even death.

Every year, thousands of workers are subject to burns and other injuries due to arc flash events. Due to the significant threats posed by arc flash events, professional and trade associations including the Institute for Electrical and Electronics Engineers (IEEE) and the National Fire Protection Association (NFPA) have conducted substantial research and testing to quantify and improve related electrical safety standards. In particular, these efforts are directed to predicting the hazards associated with arc faults and the accompanying arc blasts, in order to provide practical workplace safeguards.

Manufacturers over the years have incorporated various protection devices in their instruments starting with mechanical cut-outs on analog meter, diode and varistor protection for specific ranges. However, these types of electrical protection are generally located inside the meter. While internal protection may protect the meter, the end-user is still exposed to electrical flash or arc at the probe tips traveling along the test leads to the meter. Thus, there is still a need of safety equipment for safeguarding the technician against arc flashes that may arise during testing or maintenance of electrical equipment.

One of the ways to mitigate the risk of damage and injury is by the use of protective clothing, by restricting work on energized equipment, and procedures mandated by regulatory agencies. However, use of protective gear which fully encloses the personnel makes it difficult to perform maintenance operations. Further, sometimes maintenance may need to be performed on energized equipment. So, the available solutions or regulations may not be adequate enough to prevent arc flash related accidents.

Applicant believes that a related reference may correspond to U.S. Pat. No. 7,538,557 B2 (hereinafter referred to as '557 Patent). The '557 Patent provides a circuit tester including an AFCI with ground fault circuit technology capabilities having two pairs of leads connected in series to opposite ends of each circuit tester for connecting the AFCI between an electrical circuit load and a power source to detect electrical circuit and/or appliance ground fault current leakage in an amount greater than approximately 30 mA and/or 50 A, as well as to detect parallel arcing on an electrical circuit or appliance in an amount greater than approximately 50 A and/or 70 A. As with the other known systems, the '557 Patent may be able to detect electrical arc or flashes but may still not provide any solution to safeguard the technician against such arc flashes.

Other documents describing the closest subject matter provide for a number of more or less complicated features that fail to solve the problem in a convenient and efficient manner. None of these documents suggest the novel features of the present invention.

SUMMARY OF THE INVENTION

It is one of the main objectives of the present invention to provide an electrical testing system which provides safety for the technicians against the hazards of exposure to arc flashes.

It is another objective of the present invention to provide an electrical testing system which can be implemented for current electrical units without any modifications thereto.

It is yet another objective of the present invention to provide an electrical testing system which is simple to use and cost-effective.

Further objects of the invention will be brought out in the following part of the specification, wherein detailed description is for the purpose of fully disclosing the invention without placing limitations thereon.

BRIEF DESCRIPTION OF THE DRAWINGS

With the above and other related objects in view, the invention consists in the details of construction and combination of parts as will be more fully understood from the following description, when read in conjunction with the accompanying drawings in which.

DETAILED DESCRIPTION OF THE EMBODIMENTS OF THE INVENTION

Illustrative embodiments of the present invention are described below. The following explanation provides specific details for a thorough understanding of and enabling description for these embodiments. One skilled in the art will understand that the invention may be practiced without such details. In some instances, well-known structures, processes and functions have not been shown or described in detail to avoid unnecessarily obscuring the description of the embodiments.

It shall be noted that unless the context clearly requires otherwise, throughout the description, the words "comprise," "comprising," "include," "including," and the like are to be construed in an inclusive sense as opposed to an exclusive or exhaustive sense; that is to say, in the sense of "including, but not limited to." Words using the singular or plural number also include the plural or singular number, respectively while adhering to the concepts of the present invention. Furthermore, references to "one embodiment" and "an embodiment" are not intended to be interpreted as excluding the existence of additional embodiments that also incorporate the recited features.

Figure 1:
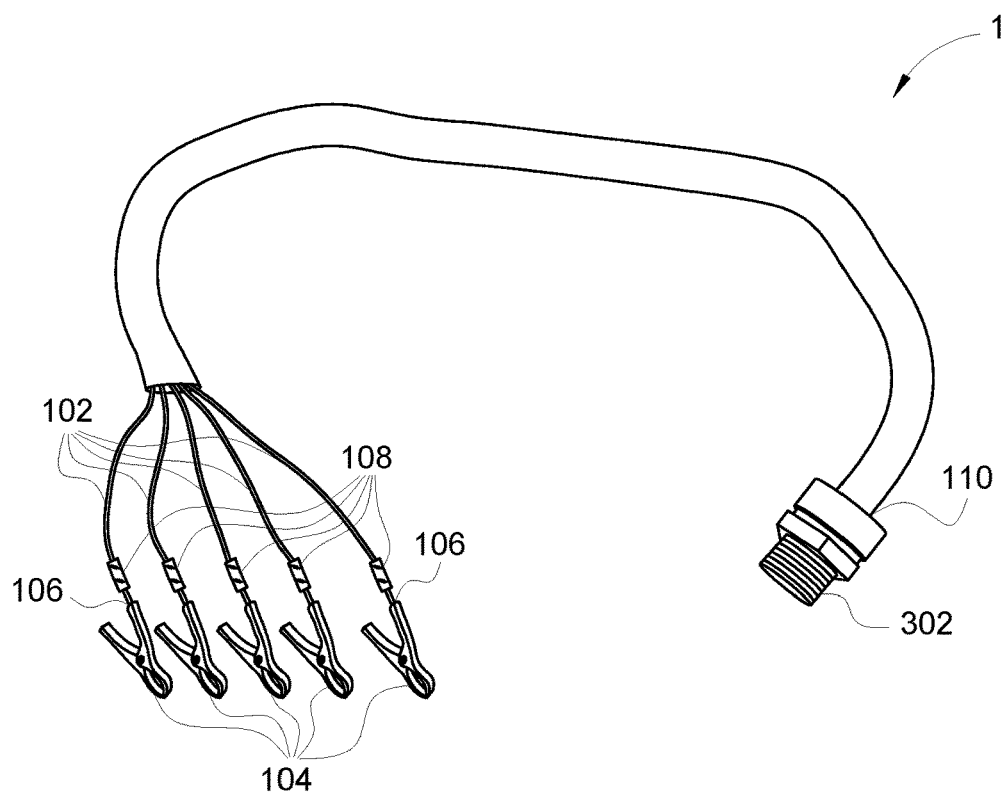
FIG. 1 illustrates a diagrammatic view of a fused test connection, in accordance an embodiment of the present disclosure.
Figure 2:
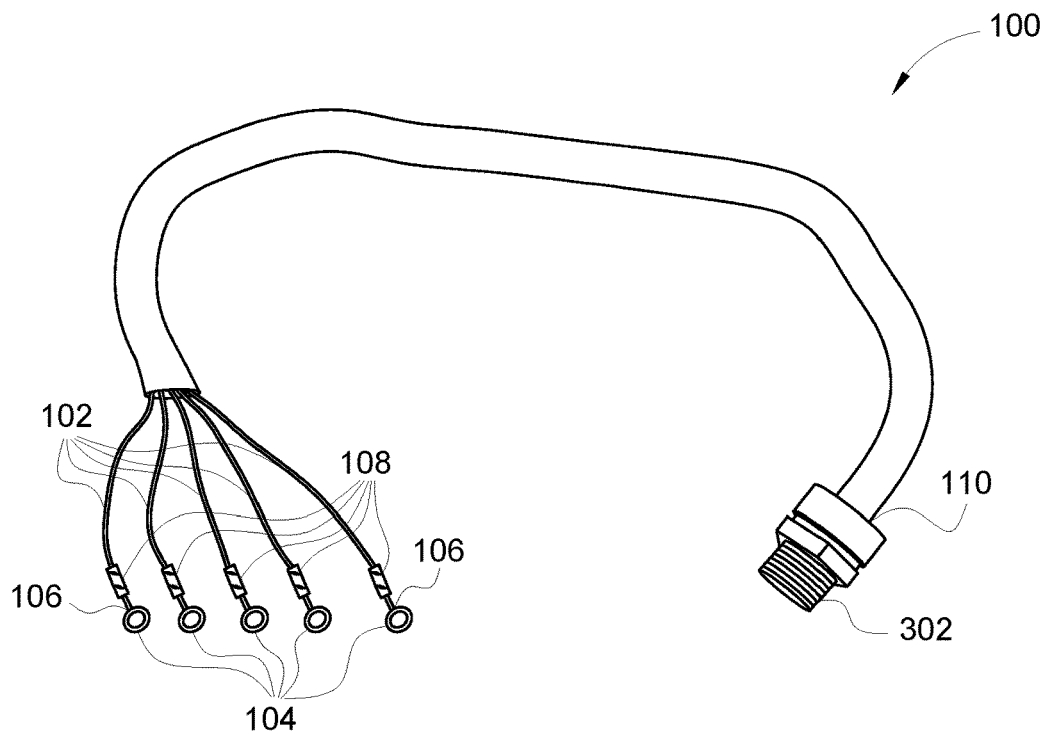
FIG. 2 illustrates a diagrammatic view of a fused test connection, in accordance with another embodiment of the present disclosure.

Referring to the drawings in general, FIGS. 1-2 illustrate respective diagrammatic views of a fused test connection (designated by the numeral 100), in accordance with two alternate embodiments of the present disclosure. The fused test connection 100 may be implemented in an electrical testing system (as discussed later in reference to FIG. 3). The fused test connection 100 of the present disclosure provides safety for the technicians against the hazards of exposure to arc flashes during testing of electrical units. The fused test connection 100 may further be implemented during carrying of maintenance activities for such electrical units, thus providing safety to the maintenance personnel against the hazards of exposure to arc flashes or the like.

The fused test connection 100, generally, includes one or more test leads 102 which are basically cables or wires for allowing propagation of electric current therein. In the illustrated examples, as shown in FIGS. 1-2, the fused test connection 100 is a 5-wire test connection having five number of test leads 102 therein. Such 5-wire test connection are implemented for 3-phase connection configurations with three number of test leads 102 being "active," one being "neutral" and one being "ground." These types of systems and configurations are well known in the art and thus have not been described in detail herein for the brevity of the present disclosure. It may be contemplated that, in other examples, the fused test connection 100 may be a 3-wire test connection or 4-wire test connection without affecting the scope of the present disclosure.

Each of the test leads 102 may include a clip 104 (also, sometimes referred to as "clamp" in the art) provided at a first end 106. The clip 104 may be used for connecting the corresponding test lead 102 to the required connection point or port in the electrical units which needs to be tested. In one or more examples, the clips 104 may be soldered to the test leads 102 at the respective first ends 106. FIG. 1 illustrates the fused test connection 100 with the test leads 102 having the clips 104 configured for temporary installations to the electrical units. Such clips 104 may be "alligator-type" clips (also, sometimes known as battery style clamps) are well known in the art. It may be appreciated that these "alligator-type" clips 104 are generally spring loaded, and may be opened by applying tension thereto and attached to the connection points by releasing the tension applied thereto, and similarly may be removed from the connection points, as required.

FIG. 2 illustrates an alternate embodiment of the fused test connection 100 with the test leads 102 having the clips 104 configured for permanent installations to the electrical units. As illustrated, the clips 104 adapted for permanent installations may be "ring-type" clips which are also well known in the art. The ring-type clips 104 may be of varying sizes, i.e. hole diameter, depending on the requirement of the electrical units. In one example, the ring-type clips 104 may be ½-¾ inch K.O. types which have been widely adapted as industry standards in electrical systems. The present fused test connection 100 with the test leads 102 having the ring-type clips 104 are adapted to remain permanently installed in the panel of the electrical units for providing safe future testing conditions for maintenance personnel.

In some examples, the test leads 102, in the fused test connection 100, may utilize fine, copper wire generally coated with highly flexible silicone rubber. This type of insulation maintains its flexibility in extreme temperature conditions. In some examples, the test leads 102 may double coat the copper wire with silicon since this serves as a visible damage control indication should the test leads get nicked or cut. In one example, the test leads 102 may be SIS wires. SIS is commonly referred to as switch-board or panel-board wire. It is a building wire product made of an insulated copper conductor, usually tin coated, with thermoset, cross-linked polyethylene (XLPE) insulation. Further, the test leads 102 are stranded for high flexibility to make installation in tight spaces easier, and are tinned to facilitate soldering. Other possible types and configurations of the test leads 102 as known in the art may be utilized in the fused test connection 100 without affecting the scope of the present disclosure.

According to an embodiment of the present disclosure, the fused test connection 100 incorporates a suitably rated fuse 108 in each of the test leads 102. In an embedment, the fuse 108 is provided proximal to a first point of connection, i.e. the fuse 108 is disposed close to the first end 106 of the test leads 102; or, in other words, close to the clips 104 of each of the test leads 102. In one or more examples, the fuse 108 employed for the fused test connection 100 of the present disclosure is a 600V and 0.5-20 A rated fuse which is generally sufficient for testing of electrical units with the potential of 480-600V. In other examples, the fuse 108 may include less expensive fuse rated at 250V and 0.5-20 A which may be utilized for electrical units operating at the potential of 120-240V.

It may be understood that the fuse 108 opens the circuit closer to the source (i. e. at the connection with the electrical unit) and prevents propagation of the fault further down the test leads 102. While general purpose fuses do an adequate job in low voltage or low power AC circuits, they do not fully open when exposed to high voltage/energy industrial circuits. A fuse's ability to open under these high energy conditions is identified by its HRC (High Rupture Current) rating. In one or more examples, the fuse 108 utilized in the fused test connection 100 of the present disclosure includes high HRC-type fuses, in combination with high quality test lead wire, in order to provide superior end-user protection.

Figure 3:
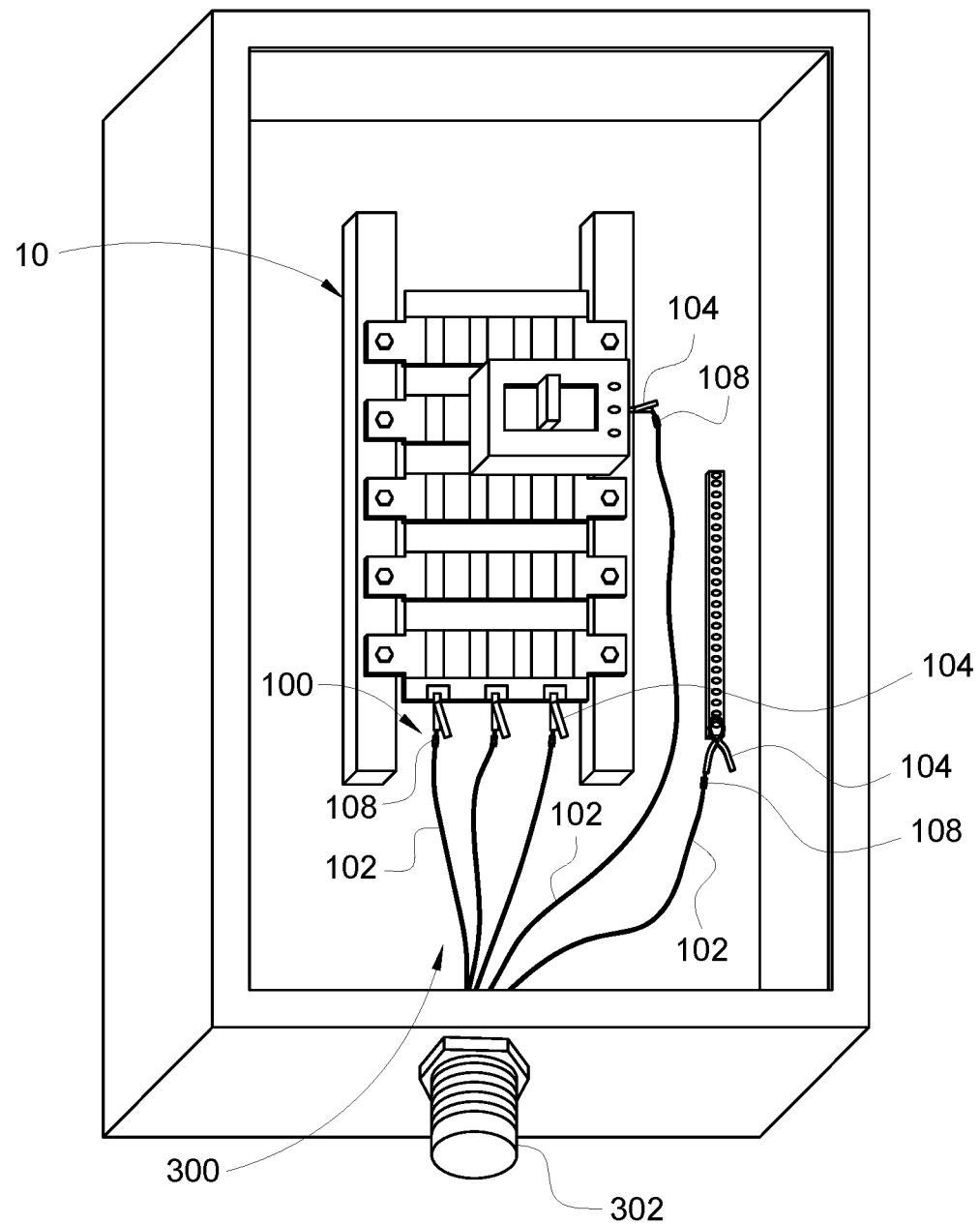
FIG. 3 illustrates a diagrammatic view of an electrical testing system implementing the fused test connection for testing purposes of an electrical unit, in accordance with one or more embodiments of the present disclosure.

According to an embodiment of the present disclosure, the fused test connection 100 (as discussed in the preceding paragraphs) may be implemented in an electrical testing system 300 (as illustrated in FIG. 3). The electrical testing system 300 may be utilized for complete testing of the electrical units (generally represented by the numeral 10 in FIG. 3). As most common electrical units in the United States currently operate both 480V 5-wire configuration and 208V 5-wire configurations, the electrical testing system 300 of the present disclosure incorporate the fused test connection 100 along with a 5-pole female plug, generally designated by the numeral 302 in the associated drawings.

The female plug 302, also sometimes known as receptacle, may be a 5-pole female standardized, miniaturized and insulated female plug/receptacle. In particular, the 5-pole female plug 302 as utilized in the electrical testing system 300 of the present disclosure is an insulated arc-resistant plug. The female plug 302 configures the test leads 102 of the fused test connection 100 to be plugged directly into a phase rotation/voltage test meter (not illustrated). It may be seen from the associate drawings that the female plug 302 may be connected to the test leads 102 at their second ends 110 (as shown in FIGS. 1-2).

The 5-pole standardized female plug 302 would allow for safely testing phase rotation on 600V, 480V and 208V 3-phase systems. Also, the electrical testing system 300 would allow for the voltage testing from 'phase to ground', 'phase to neutral' and 'phase to phase' of all three phases of the electrical unit 10. It may be understood that for the electrical units 10 that do not utilize a neutral phase, or all three phases, the unused poles may simply be left blank, although they would incorporate a standard order of sequence. It may, thus, be understood that the electrical testing system 300 of the present disclosure may be configured to test basically all low and high voltage electrical systems; for example, but not limited to, 600V/347V, 480V/277V, 208V/120V and 240V/120V.

Figure 4:
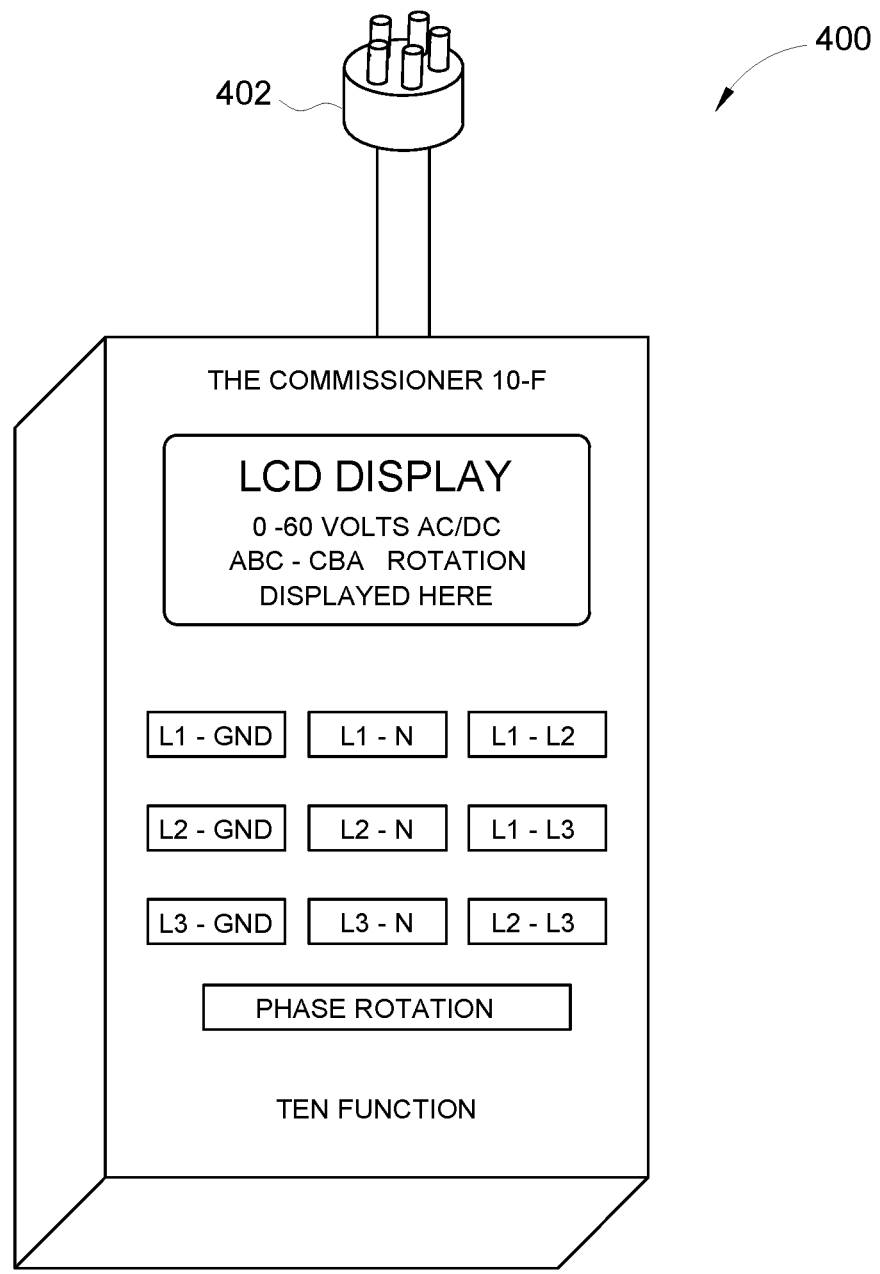
FIG. 4 illustrates a diagrammatic view of an electrical test meter to be implemented with the electrical testing system of FIG. 3, in accordance with one or more embodiments of the present disclosure.

As mentioned earlier, the electrical testing system 300 of the present disclosure may be implemented with a single electric test meter that may test phase rotation as well as voltage with a single piece of equipment by means of the standardized female plug 302. FIG. 4 illustrates an electrical test meter 400 to be implemented with the electrical testing system 300. The electrical test meter 400 is a 10-function handheld electrical test meter. Generally, the electrical test meter 400 is a phase rotation and AC\DC voltmeter which connects directly with the test leads 102, in the fused test connection 100, via a male plug 402 to be coupled with the female plug 302 of the electrical testing system 300. The electrical test meter 400 may be fully insulated and may further have a magnetic base for easy use.

Figure 5:
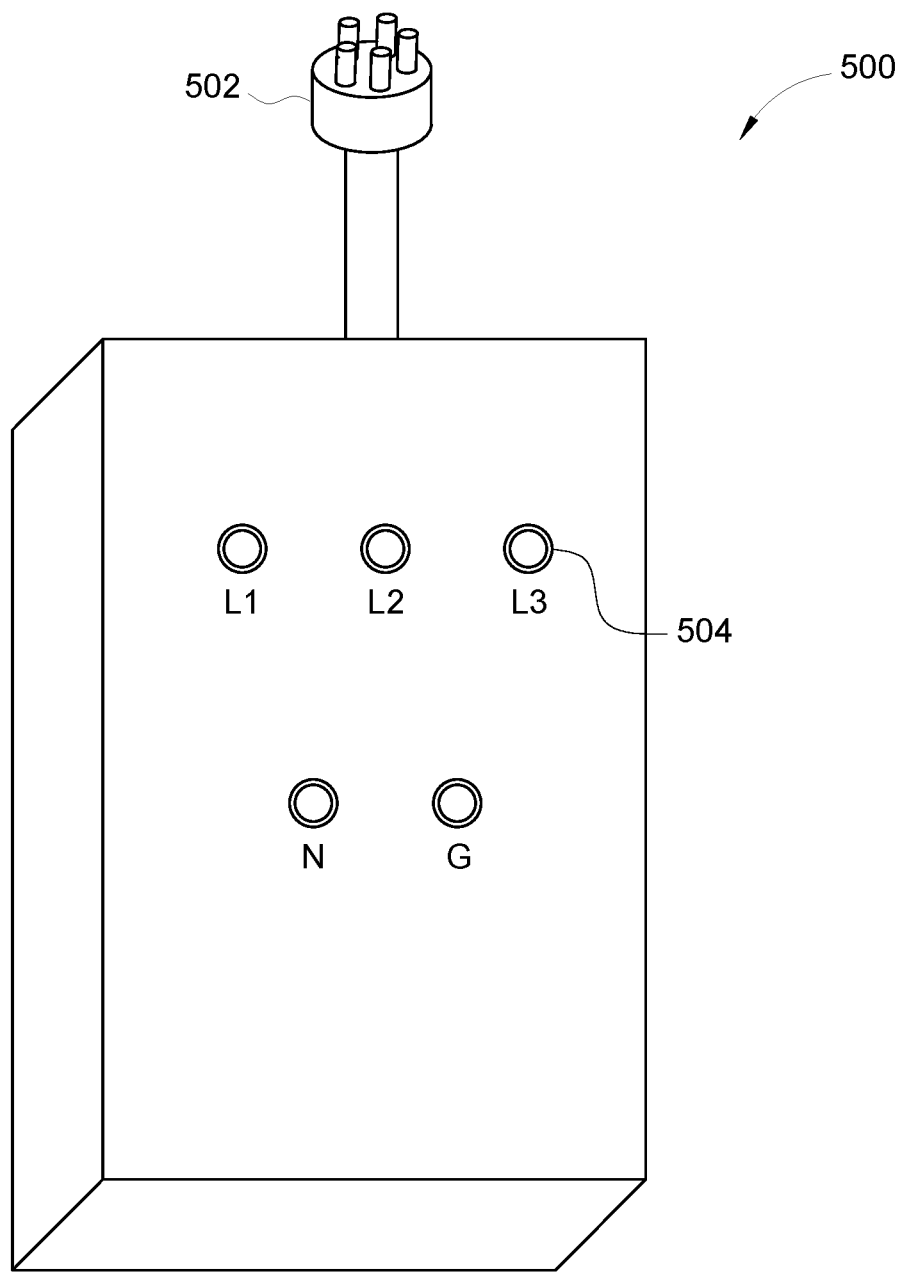
FIG. 5 illustrates a diagrammatic view of an electrical test unit to be implemented with the electrical testing system of FIG. 3, in accordance with one or more embodiments of the present disclosure.

FIG. 5 illustrates an electrical test unit 500 to be implemented with the electrical testing system 300. The electrical test unit 500 is an alternative to the 10-function electrical test meter 400 (as shown in FIG. 4). Generally, the electrical test unit 500 have no electronics and simply provides the user with a safe method to connect the test equipment they may already have to the test leads 102, in the fused test connection 100, via a male plug 502 to be coupled with the female plug 302 of the electrical testing system 300. As illustrated, the electrical test unit 500 may include multiple test ports 504 which allows for needle style leads as well as standard plug attachment. The electrical test unit 500 may also be fully insulated and may further have a magnetic base for easy use.

The electrical testing system 300 is configured for testing all types of electrical units, either through a temporary connection to the electrical bussing (of the electrical unit 10) via the alligator-type clips 104 (as illustrated in FIG. 1 and further in FIG. 3), or may also be implemented as a permanent set of test leads 102 via the ring-type clips 104 (as illustrated in FIG. 2) for the electrical unit 10. It may be contemplated that although the associated drawings, i.e. FIG. 3 only show test leads 102 connected to the electrical unit 10 using temporary alligator-type clips 104, it may similarly utilize permanent ring-type clips 104 without any limitations. Further, it may be understood that the length of the test lead 102 may be varied based on the requirements of the electrical testing system 300 for different types of electrical units 10, without any limitations.

The most recent changes to the industry while performing standard test requirements as per NETA/ANSI is the introduction of the new safety requirements as put forth in the NFPA 70E changes added to article 100. Also additional regulations FED OSHA 1910, OSHA 1926 are being added at the Federal level EM385-1-1 USACE Health & Safety Manual. The additional changes in the NFPA 70E 2018 edition are expected to even be more restrictive. Therefore, there is an immediate need of electric testing equipment which can meet the said requirements, while still providing safeguards against exposure of technicians and work personnel to possible arc flashes.

The fused test connection 100, and the incorporating electrical testing system 300, of the present disclosure mitigates the inherent life safety dangers involved in electrical testing. This is achieved by reducing the incident energy and preventing the exposure to life threatening burns. The present electrical testing system 300 makes electrical testing safer for construction and maintenance personnel, as well as technicians involved in the regular testing of high voltage electrical units. The arc safe electrical testing system 300 of the present disclosure further eliminates much of the cost associated with testing and commissioning the electrical units, such as the exemplary electric unit 10.

It may be contemplated by a person skilled in the art that the present electrical testing system 300 may be utilized for testing all types of electrical units, including 120/240 Single Phase, 120/208 Single Phase & 3-Phase, 480/277 VAC Single Phase, & 3-Phase up to 600 VAC. Further, the electrical testing system 300 may be utilized for testing large bussing found on secondary unit sub-stations with power transmission lines of varying capacities, like 34500 KV, 21000 KV, 13800 KV, 12470 KV, 4160 KV, etc. The present electrical testing system 300 may further be configured for verifying phase rotation, measure the voltage from L1-GND, L2-GND, L3-GND, L1-N, L2-N, L3-N and then L1-L2, L1-L3, L2-L3, etc., for example, via implementation of the electrical test meter 400 (as discussed with reference to FIG. 4).

The foregoing description conveys the best understanding of the objectives and advantages of the present invention. Different embodiments may be made of the inventive concept of this invention. It is to be understood that all matter disclosed herein is to be interpreted merely as illustrative, and not in a limiting sense.

What is claimed is:

1. An electrical testing system for an electrical unit, comprising:
    a fused test connection including one or more test leads, a clip provided at first ends of the one or more test leads to connect to the electrical unit and a fuse disposed at the first ends of the one or more test leads; and
    a female plug adapted to allow plugging of a test meter by mating with a male plug thereof, said female plug being a 5-pole insulated plug.

2. The electrical testing system of claim 1, wherein the fused test connection comprises five number of test leads.

3. The electrical testing system of claim 1, wherein the fused test connection has 3-phase connection configurations with three number of test leads being active, one being neutral and one being ground.

4. The electrical testing system of claim 1, wherein the one or more test leads include copper wire coated with silicone rubber.

5. The electrical testing system of claim 1, wherein the clips are soldered to the test leads at the respective first ends.

6. The electrical testing system of claim 1, wherein the clips include alligator-type clips adapted to provide temporary connection with the electrical unit.

7. The electrical testing system of claim 1, wherein the clips include ring-type clips adapted to provide permanent connection with the electrical unit.

8. The electrical testing system of claim 1, wherein the fuse is a 600V and 0.5-20 A rated fuse.

9. The electrical testing system of claim 1, wherein the fuse is a 250V and 0.5-20 A rated fuse.

10. The electrical testing system of claim 1, wherein the fuse is an HRC-type fuse.

11. The electrical testing system of claim 1, wherein the test meter is a 10-function handheld electrical test meter.

12. The electrical testing system of claim 1, wherein the test meter is adapted to allow connecting test equipment to the electrical unit.

13. The electrical testing system of claim 12, wherein the test meter includes multiple test ports adapted to allow connection with needle style leads of the test equipment.

* * * * *